United States Patent
Mikami et al.

(10) Patent No.: US 11,061,337 B2
(45) Date of Patent: Jul. 13, 2021

(54) EXPOSURE APPARATUS AND ARTICLE MANUFACTURING METHOD

(71) Applicant: CANON KABUSHIKI KAISHA, Tokyo (JP)

(72) Inventors: Koji Mikami, Nikko (JP); Atsushi Shigenobu, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/809,097

(22) Filed: Mar. 4, 2020

(65) Prior Publication Data
US 2020/0292945 A1 Sep. 17, 2020

(30) Foreign Application Priority Data
Mar. 12, 2019 (JP) .............................. JP2019-045138

(51) Int. Cl.
*G03B 27/00* (2006.01)
*G03F 7/20* (2006.01)

(52) U.S. Cl.
CPC .......... *G03F 7/706* (2013.01); *G03F 7/70191* (2013.01); *G03F 7/70216* (2013.01); *G03F 7/70716* (2013.01)

(58) Field of Classification Search
CPC .. G03F 7/706; G03F 7/70191; G03F 7/70216; G03F 7/70716; G03F 7/70258; G03F 7/70308
See application file for complete search history.

(56) References Cited

U.S. PATENT DOCUMENTS 6,307,618 B1 * 10/2001 Suzuki ................ G03F 7/70308
355/53
2001/0038497 A1 11/2001 Sudoh
(Continued)

FOREIGN PATENT DOCUMENTS

| EP | 1349201 A1 | 10/2003 |
|---|---|---|
| JP | 3064432 B2 | 7/2000 |
| JP | 2014120682 A | 6/2014 |

OTHER PUBLICATIONS

Extended European Search Report issued in European Appln. No. 20159086.6 dated Aug. 17, 2020.
(Continued)

*Primary Examiner* — Peter B Kim
(74) *Attorney, Agent, or Firm* — Rossi, Kimms & McDowell LLP

(57) ABSTRACT

An exposure apparatus that projects a pattern of an original onto a substrate via a projection optical system and exposes the substrate is provided. The apparatus comprises an aberration correction member arranged on an optical path of exposure light between the original and the substrate, and a driver which drives the aberration correction member. The aberration correction member includes a first optical element including a first surface having a three-fold rotational symmetric aspherical shape with respect to an optical axis of the exposure light, and a second optical element spaced apart from the first optical element along the optical axis and including a second surface facing the first surface and having an aspherical shape that complementarily corrects an aberration generated by the first optical element.

14 Claims, 7 Drawing Sheets

(56) References Cited

U.S. PATENT DOCUMENTS

| | | |
|---|---|---|
| 2004/0027549 A1* | 2/2004 | Nagayama .............. G03F 7/706 |
| | | 355/55 |
| 2009/0115989 A1 | 5/2009 | Tanaka |
| 2010/0201962 A1* | 8/2010 | Juergens ............. G03F 7/70258 |
| | | 355/55 |
| 2011/0069295 A1 | 3/2011 | Kraehmer |
| 2014/0168623 A1 | 6/2014 | Hoshino |
| 2018/0196256 A1 | 7/2018 | Walter |

OTHER PUBLICATIONS

Search Report and Written Opinion issued in SG Appln. No. 10202002243W dated Dec. 3, 2020.

* cited by examiner

F I G. 1
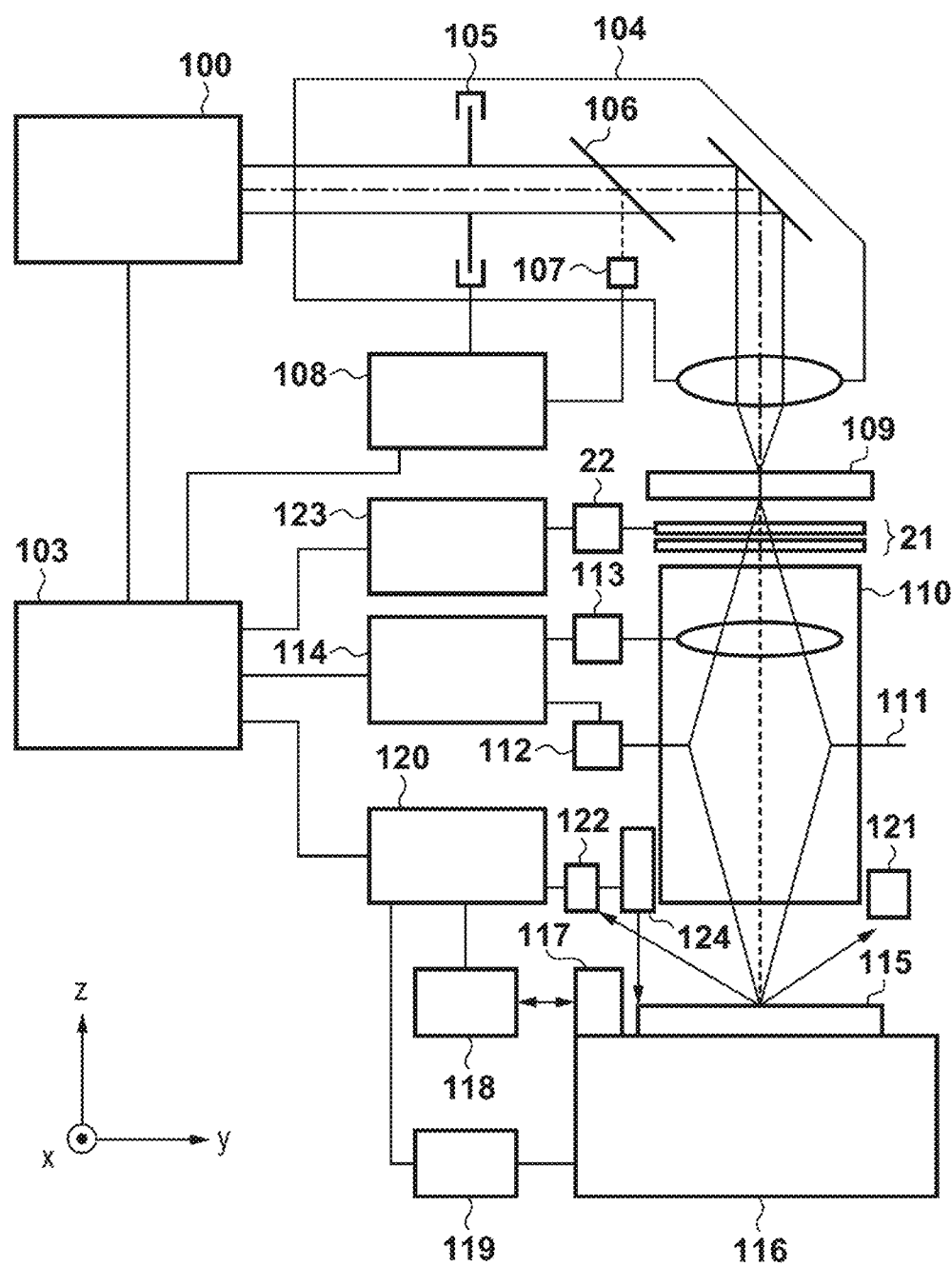

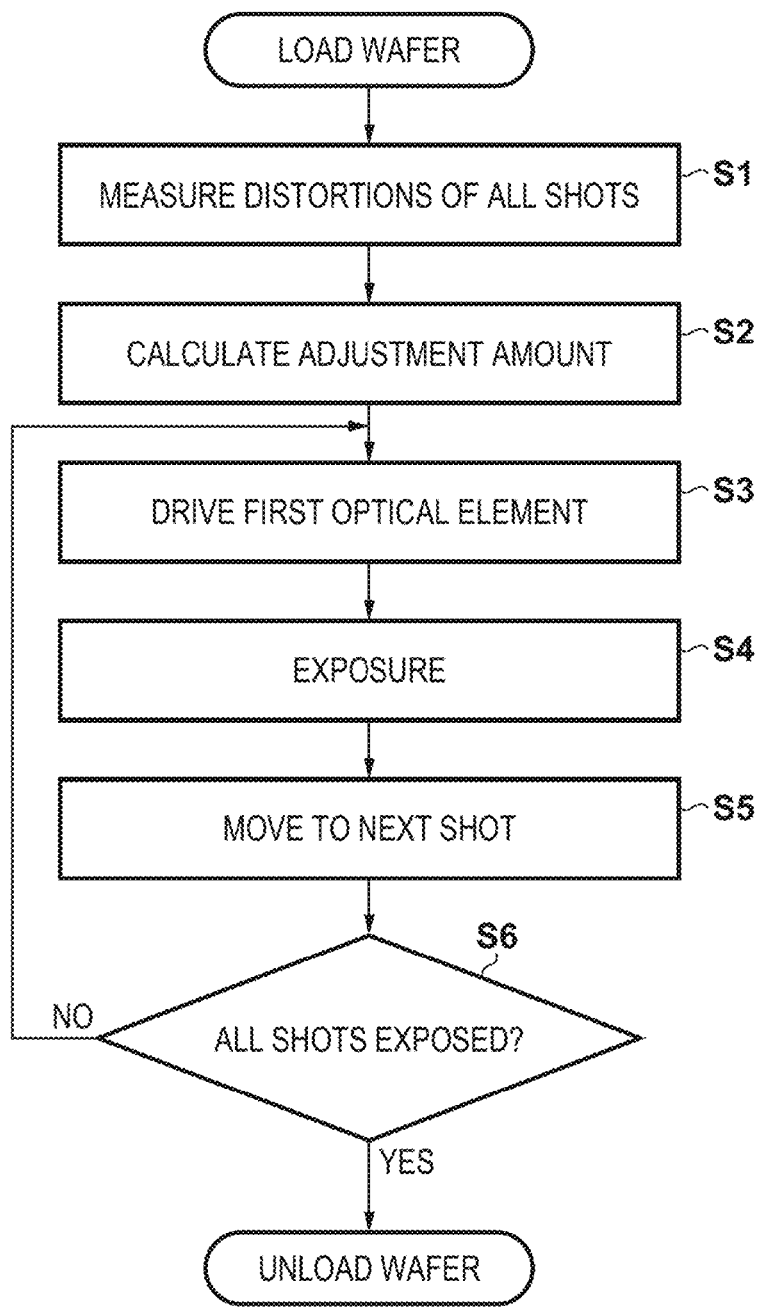

Dr-Dl = Δbase_LR

Du-Dd = Δbase_UD

EXPOSURE APPARATUS AND ARTICLE MANUFACTURING METHOD

BACKGROUND OF THE INVENTION

Field of the Invention

The present invention relates to an exposure apparatus and an article manufacturing method.

Description of the Related Art

An exposure apparatus is used for manufacturing a semiconductor device or a flat panel display. Along with high integration of semiconductor devices and the high resolution standardization of a flat panel display, miniaturization and multilayering of wirings are improved. With miniaturization of patterns, the higher overly accuracy between layers has been required. On the other hand, in the wiring layer, as the semiconductor manufacturing processes become postprocesses, local distortion occurs in each shot region such as a magnification difference after the process treatment in underlayer exposure, a distortion, warping of the substrate, or the like, and this causes a problem such as a deterioration in overlay accuracy.

Japanese Patent No. 3064432 discloses a technique in which an anisotropic distortion shape, which is not a rotationally symmetric or two-fold symmetric component, is corrected by tilting some elements of a projection lens without using a non-axisymmetric lens. Japanese Patent Laid-Open No. 2014-120682 discloses a technique of correcting a two-fold symmetric aberration.

In recent years, improvement in productivity of an exposure apparatus to reduce device cost, that is, improvement in throughput corresponding to the number of substrates processed per unit time has been regarded as important. Therefore, high-speed stage driving, improvement in exposure illuminance, and the like are required. However, to cope with them, the distortion of an exposure shot due to the expansion/contraction of the substrate caused by the exposure heat of the adjacent shot cannot be ignored. The closer to the adjacent shot, the larger the thermal expansion due to the influence of heat. Therefore, the magnification changes among the top, bottom, left, and right portions of the shot region, and this is one factor that causes an asymmetric distortion shape.

Japanese Patent No. 3064432 refers to correction of anisotropic distortion by tilting the optical element. However, with this technique, a coma aberration or astigmatism that varies among image heights occur along with the occurrence of distortion, so it is impossible to efficiently correct only the asymmetric distortion. Further, Japanese Patent Laid-Open No. 2014-120682 discloses only correction of a vertical/horizontal magnification difference, and does not disclose correction of a shot region deformed into a trapezoidal shape.

SUMMARY OF THE INVENTION

The present invention provides, for example, an exposure apparatus advantageous in correction of the shape of a shot region.

The present invention in its one aspect provides an exposure apparatus that projects a pattern of an original onto a substrate via a projection optical system and exposes the substrate, the apparatus comprising an aberration correction member arranged on an optical path of exposure light between the original and the substrate, and a driver configured to drive the aberration correction member, wherein the aberration correction member comprises a first optical element including a first surface having a three-fold rotational symmetric aspherical shape with respect to an optical axis of the exposure light, and a second optical element spaced apart from the first optical element along the optical axis and including a second surface facing the first surface and having an aspherical shape that complementarily corrects an aberration generated by the first optical element, and the driver performs at least one of rotation about the optical axis and driving along the optical axis of at least one of the first optical element and the second optical element.

Further features of the present invention will become apparent from the following description of exemplary embodiments (with reference to the attached drawings).

BRIEF DESCRIPTION OF THE DRAWINGS

FIG. 1 is a view showing the arrangement of an exposure apparatus according to the first embodiment;

FIG. 7 is a flowchart illustrating an exposure method according to the first embodiment;

DESCRIPTION OF THE EMBODIMENTS

Figure 2:
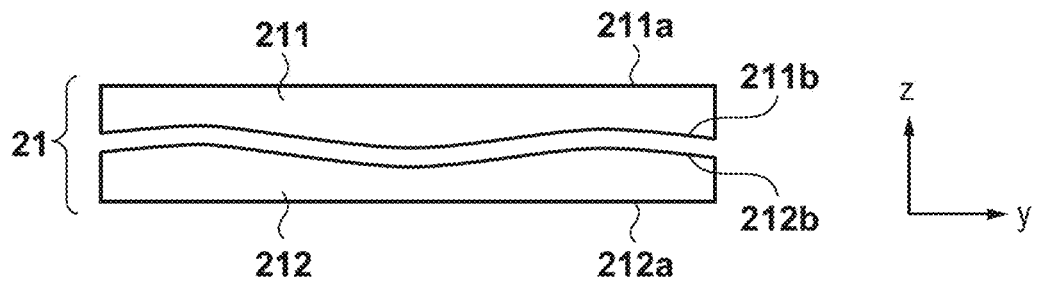
FIG. 2 is a view showing the arrangement of an aberration correction member according to the first embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

FIG. 1 is a view showing the arrangement of an exposure apparatus according to the first embodiment. In the specification and the accompanying drawings, directions will be indicated on an XYZ coordinate system in which the surface (horizontal plane) of a wafer 115 serving as a substrate is set as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively.

A main controller 103 comprehensively controls the respective components of the exposure apparatus to be described later to perform an exposure process. The main controller 103 can be implemented by, for example, a computer apparatus including a CPU and a memory (storage unit).

A light source 100 can output, as exposure light, a plurality of light beams having different wavelength bands. The light emitted from the light source 100 is shaped into a predetermined shape via a shaping optical system (not shown) of an illumination optical system 104. The shaped light enters an optical integrator (not shown) in which a plurality of secondary light sources are formed to illuminate a reticle 109 to be described later with a uniform illuminance distribution.

The shape of the aperture of an aperture stop 105 of the illumination optical system 104 is approximately circular, and an illumination optical system controller 108 can set the diameter of the aperture and thus the numerical aperture (NA) of the illumination optical system 104 to a desired value. In this case, the value of the ratio of the numerical aperture of the illumination optical system 104 to the numerical aperture of a projection optical system 110 is a coherence factor (σ value), so that the illumination optical system controller 108 can set the σ value by controlling the aperture stop 105 of the illumination optical system 104.

A half mirror 106 is arranged on the optical path of the illumination optical system 104, and a part of the exposure light that illuminates the reticle 109 is reflected by the half mirror 106 and extracted. A photosensor 107 for ultraviolet light is arranged on the optical path of the reflected light of the half mirror 106, and generates an output corresponding to the intensity (exposure energy) of the exposure light. A pattern of a semiconductor device circuit to be printed is formed on the reticle 109 serving as an original (mask), and is illuminated by the illumination optical system 104. The projection optical system 110 is arranged so as to reduce the pattern of the reticle 109 at a reduction ratio β (for example, β=½) and project it onto one shot region on the wafer 115 coated with a photoresist. The projection optical system 110 can be a refractive optical system, a catadioptric optical system, or the like.

On the pupil plane (a Fourier transform plane for the reticle) of the projection optical system 110, an aperture stop 111 including an approximately circular aperture is arranged, and the diameter of the aperture can be controlled by an aperture stop driver 112 such as a motor. An optical element driver 113 moves an optical element such as a field lens that constitutes a part of a lens system in the projection optical system 110 along the optical axis of the projection optical system 110. Thus, while reducing various types of aberrations of the projection optical system 110, the projection magnification is improved and the distortion error is decreased. A projection optical system controller 114 controls the aperture stop driver 112 and the optical element driver 113 under the control of the main controller 103.

A wafer stage 116 (substrate stage) that holds the wafer 115 is movable in a three-dimensional direction, and can move in the optical axis direction (Z direction) of the projection optical system 110 and in a plane (X-Y plane) orthogonal to the optical axis direction. Note that as described above, the surface (horizontal plane) of the wafer 115 is set as the X-Y plane. Accordingly, in FIG. 1, the Z-axis extends in parallel to the optical axis of the projection optical system 110 in the direction from the wafer 115 to the reticle 109, and the X-axis and the Y-axis extend in directions orthogonal to each other on a plane perpendicular to the Z-axis. In FIG. 1, the Y-axis is in the plane of the drawing surface, and the X-axis is perpendicular to the drawing surface and extends toward the front side of the drawing surface. By measuring the distance from a moving mirror 117 fixed to the wafer stage 116 by a laser interferometer 118, the X-Y plane position of the wafer stage 116 is detected. In addition, the positional deviation between the wafer 115 and the wafer stage 116 is measured using an alignment measurement system 124 (measurement device). A stage controller 120 under the control of the main controller 103 of the exposure apparatus controls, based on the result of the measurement using the alignment measurement system 124, the stage driver 119 such as a motor to move the wafer stage 116 to a predetermined X-Y plane position.

A light emitting optical system 121 and a detection optical system 122 detect the focus plane. The light emitting optical system 121 emits a plurality of light beams formed by non-exposure light that does not sensitize the photoresist on the wafer 115, and each light beam is condensed and reflected on the wafer 115. The light beam reflected by the wafer 115 enters the detection optical system 122. Although not shown, a plurality of light receiving elements for position detection corresponding to the respective reflected light beams are arranged in the detection optical system 122, and arranged such that the light receiving surface of each light receiving element and the reflection point of each light beam on the wafer 115 become substantially conjugate by an imaging optical system. The positional deviation of the surface of the wafer 115 in the optical axis direction of the projection optical system 110 is measured as the positional deviation of the light entering the light receiving element for position detection in the detection optical system 122.

An aberration correction member 21 is arranged on the optical path of the exposure light between the reticle 109 and the wafer 115. In the example shown in FIG. 1, the aberration correction member 21 is arranged between the reticle 109 and the projection optical system 110. The aberration correction member 21 may be arranged as a unit independent of the projection optical system 110, or may be arranged as a part of the projection optical system 110. When the aberration correction member 21 is provided in the projection optical system 110, the aberration correction member 21 may be arranged above the pupil plane in the projection optical system 110 and in the vicinity of a field lens group that condenses the light diffracted by the reticle 109 on the wafer 115. Alternatively, the aberration correction member 21 may be arranged integrally with a reticle holder or a reticle stage (not shown) that holds the reticle 109.

As shown in FIG. 2, the aberration correction member 21 includes a first optical element 211 and a second optical element 212 that is spaced apart from the first optical element 211 along the optical axis of the exposure light. The first optical element 211 and the second optical element 212 include rotational asymmetric surfaces facing each other and having the same shape. An optical element driver 22 can perform at least one of θZ rotation (rotation about the optical axis) and driving in the Z direction (Z driving) of at least one of the first optical element 211 and the second optical element 212. Further, at least one of the first optical element 211 and the second optical element 212 may be configured to be movable in the X direction and/or the Y direction orthogonal to the Z-axis by the optical element driver 22.

In FIG. 2, each of an outer surface 211a of the first optical element 211 on the reticle 109 side and an outer surface 212a of the second optical element 212 on the projection optical system 110 side has a planar shape. On the other hand, a first inner surface 211b of the first optical element 211 and a second inner surface 212b of the second optical element 212 facing each other have mutually complementary aspherical shapes.

Figure 6A:
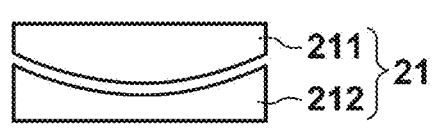
FIGS. 6A to 6C are views showing driving modes of the aberration correction member according to the first embodiment.
Figure 6B:
Figure 6C:
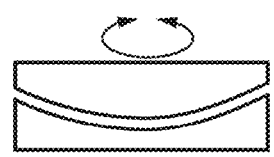

FIGS. 6A to 6C show driving modes of the aberration correction member 21. FIG. 6A shows a state similar to that shown in FIG. 2 (note that in FIG. 6A, the shape of the spacing between the first optical element 211 and the second optical element 212 is shown in a simplified manner). At least one of the first optical element 211 and the second optical element 212 can be Z-driven as shown in FIG. 6B from the state shown in FIG. 6A by the optical element driver 22. In addition, at least one of the first optical element 211 and the second optical element 212 can be θZ-rotated as shown in FIG. 6C by the optical element driver 22.

Hereinafter, aberration correction performed by Z driving and θZ rotation of at least one of the first optical element 211 and the second optical element 212 will be described. However, for the sake of simplicity of explanation, taking the first optical element 211 as a representative, and aberration correction performed by Z driving and θZ rotation of the first optical element 211 will be described below.

For example, the rotational asymmetric shape of each of the first surface 211b and the second surface 212b is expressed by the following equation:

$$Z = A(3x^2 y - y^3) + B \quad (1)$$

where A and B are constants.

Figure 5A:
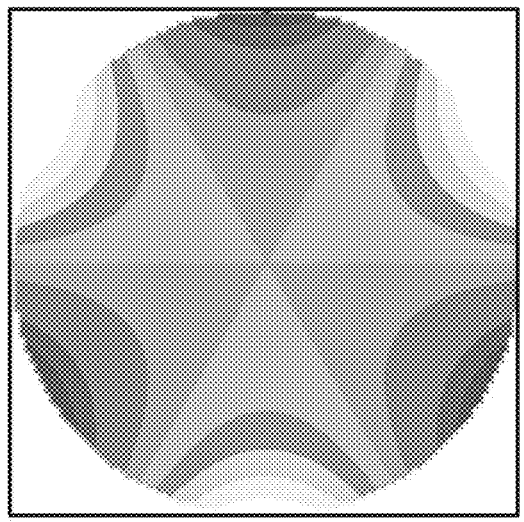
FIGS. 5A and 5B are views showing an example of the surface shape of each of optical elements of the aberration correction member according to the first embodiment.
Figure 5B:
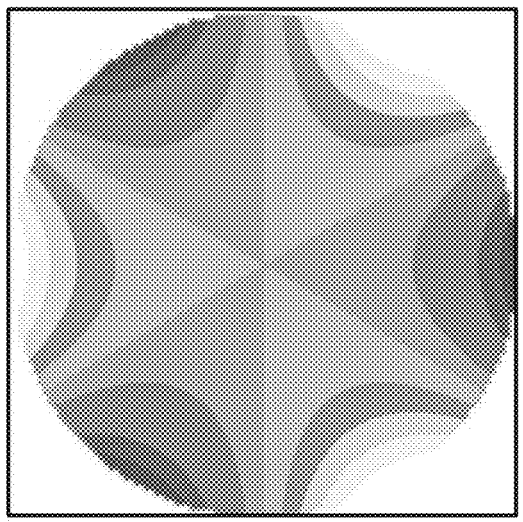

When expressed in polar coordinate display with a direction of θ=0° (X-axis direction) and a parameter $$\rho = \mathrm{sqrt}(x^2 + y^2),$$

the rotational asymmetric shape expressed by equation (1) is equivalent to $$Z = \rho^3 \sin 3\theta \quad (2)$$

and becomes a three-fold rotational symmetric aspherical shape as shown in each of FIGS. 5A and 5B.

The principal ray of the light beam diffracted on the reticle 109 is object-side telecentric, and the aspherical shapes of the first surface 211b and the second surface 212b act in a complementary manner. Therefore, the phase difference between the image heights when the light beam is transmitted through the first optical element 211 and the second optical element 212 becomes zero. When the first optical element 211 having the aspherical shape expressed by equation (1) is rotated by α, the complementarity between the first surface 211b and the second surface 212b collapses. If α is sufficiently small, the phase difference is expressed as:

$$\Phi \approx K^* \alpha R^3 \cos 3\theta$$

(where K is a constant). On the other hand, when the first optical element 211 is Z-driven by a distance d, the complementarity collapses. If d is sufficiently small, the phase difference is expressed as:

$$\Phi \approx L^* d^* R^3 \sin 3\theta$$

(where L is a constant).

In this manner, in both θZ rotation and Z driving of the first optical element 211, a phase difference expressed by a three-fold rotational symmetric component remains. It has been found that if a three-fold rotational symmetric phase difference occurs in a portion of the projection lens facing the reticle, a trapezoidal distortion as shown in each of FIGS. 4A to 4D occurs. The degree of asphericity of each of the first surface 211b and the second surface 212b in the vicinity of the optical axis is approximately zero as obtained by equation (2). Therefore, according to this embodiment, in the center of image height, a phase change due to rotation or Z driving does not occur, so no distortion shift component is generated. In addition, no coma aberration occurs. Further, a primary inclination component of the phase is not generated even on the circumference away from the optical axis by a radius R, so inclination of the image plane does not occur. Thus, as compared with a case as disclosed in Japanese Patent Laid-Open No. 2014-120682 in which a trapezoidal shape is generated by optical eccentricity, the present invention is effective since the astigmatism that occurs between image heights can be suppressed.

Figure 4A:
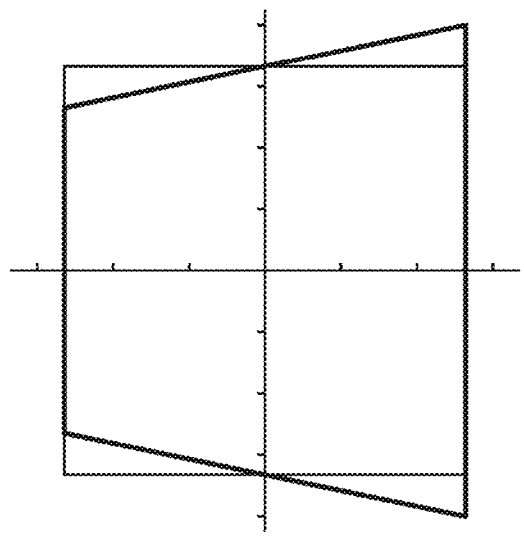
FIGS. 4A to 4D are views each showing an example of a trapezoidal distortion that occurs when the aberration correction member is driven.
Figure 4B:
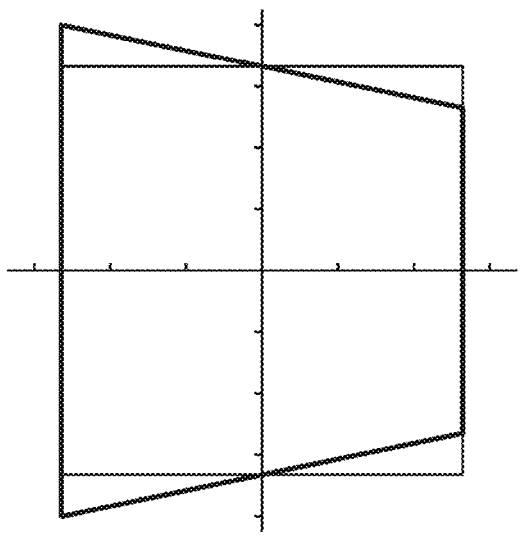
Figure 4C:
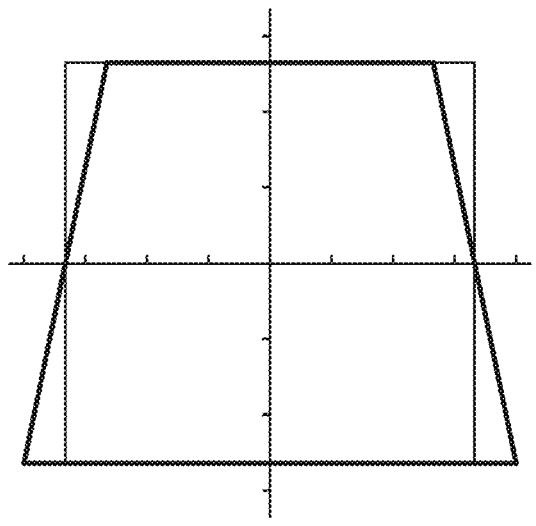
Figure 4D:
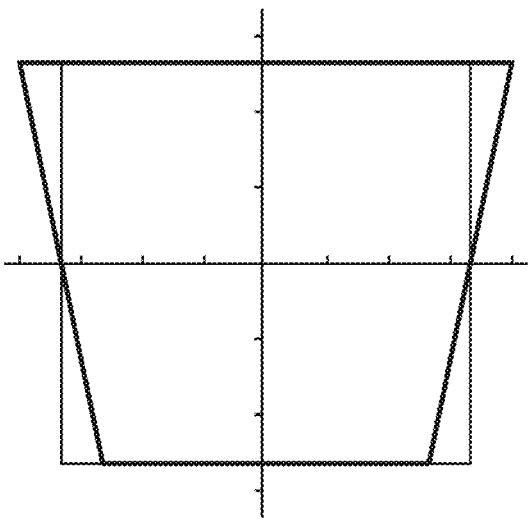
Figure 9A:
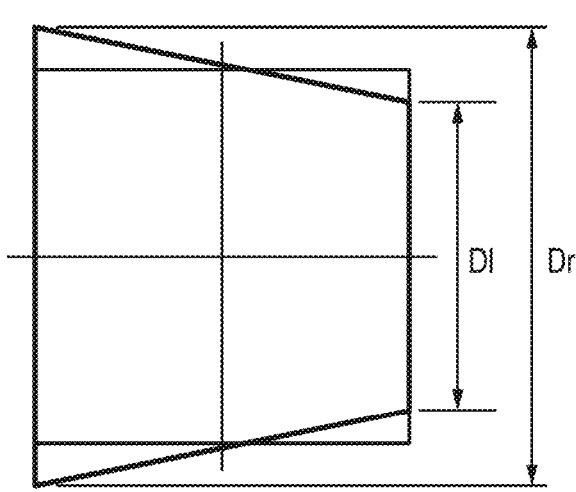
FIGS. 9A and 9B are views each showing the asymmetry of a trapezoidal component.
Figure 9B:
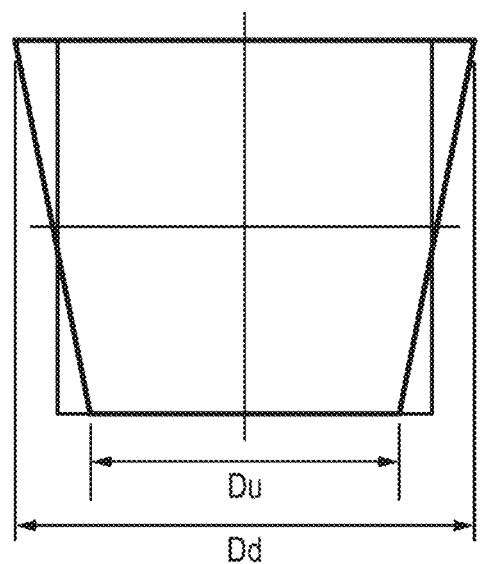

By θZ-rotating the first optical element 211 by the optical element driver 22, a trapezoidal distortion occurs in which the left and right sides (two sides along the Y direction) form the upper base and the lower base as shown in each of FIGS. 4A and 4B. Further, by Z-driving the first optical element 211 by the optical element driver 22, a trapezoidal distortion occurs in which the upper and lower sides (two sides along the X direction) form the upper base and the lower base as shown in each of FIGS. 4C and 4D. When the length difference between the two opposite sides forming the upper and lower bases of the trapezoid is Δbase, the sign of Δbase is inverted depending on the rotation direction of θZ rotation and the driving direction of Z driving, and the value of Δbase is uniquely determined by the rotation angle of θZ rotation and the driving amount of Z driving. Thus, the rotation angle of θZ rotation and the driving amount of Z driving of the first optical element 211 are adjusted. This makes it possible to correct any trapezoidal shape including a trapezoid with Δbase_LR having different left and right side lengths as shown in FIG. 9A and a trapezoid with Δbase_UD having different upper and lower side lengths as shown in FIG. 9B.

With reference to the flowchart shown in FIG. 7, an example of the exposure method according to this embodiment will be described. After a wafer is loaded, in step S1, the main controller 103 measures the shape of each of a plurality of shot regions serving as the underlayer using the alignment measurement system 124, and stores distortion data of each shot region in the storage unit. This measurement may be performed by a measurement apparatus outside the exposure apparatus. In that case, the main controller 103 acquires distortion data of each shot region from the outside.

In step S2, the main controller 103 calculates an amount (adjustment amount) that should be adjusted for the components (Δbase_LR component and Δbase_UD component) in two directions of the aberration in order to perform exposure in accordance with the shape of each shot region.

In step S3, an optical element controller 123 controls the optical element driver 22 to perform at least one of θZ rotation and Z driving of the first optical element 211 so as to adjust the Δbase_LR component and the Δbase_UD component. At this time, in order to adjust another image shift component, the projection optical system controller 114 may control the optical element driver 113 to drive the optical element of the projection optical system 110. Similarly, in order to adjust another image shift component, the stage controller 120 may control the stage driver 119 to drive the wafer stage 116.

When the driving of the first optical element 211 is completed, the main controller 103 performs exposure in step S4. In step S5, the main controller 103 controls the stage driver 119 via the stage controller 120 to drive the wafer stage 116 so as to move to a next shot region to be exposed. The main controller 103 repeats driving of the first optical element 211 and exposure based on the distortion data obtained in step S1 and the adjustment amount calculated in step S2. If it is determined in step S6 that the exposure is completed for all the shot regions, the main controller 103 unloads the wafer, loads a next wafer, and repeats the above-described procedure.

According to the exposure method based on this procedure, it is possible to perform exposure while performing adjustment in accordance with the shape of an underlayer shot region with a trapezoidal component having different right and left side lengths or the shape of an underlayer shot region with a trapezoidal component having different upper and lower side lengths. This improves the overlay accuracy.

Figure 3A:
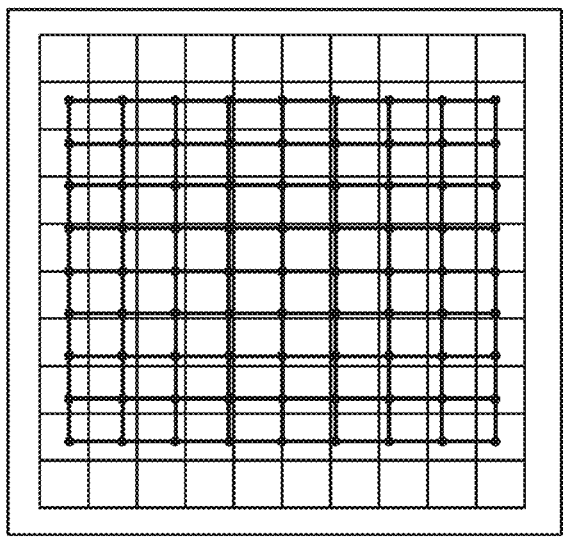
FIGS. 3A to 3D are views each showing an example of image deviation aberration due to a vertical/horizontal magnification difference.
Figure 3B:
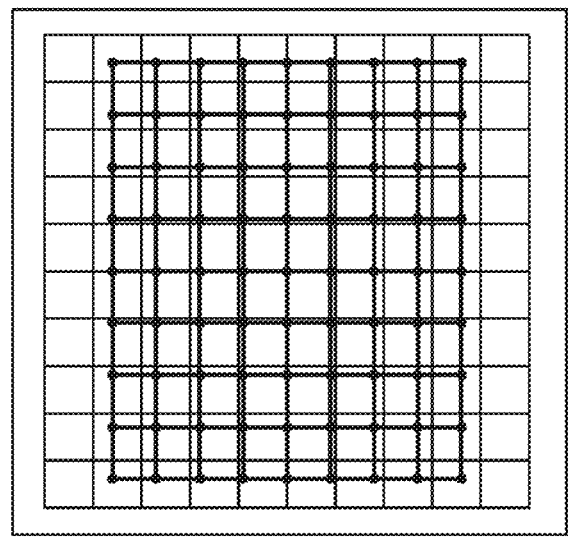
Figure 3C:
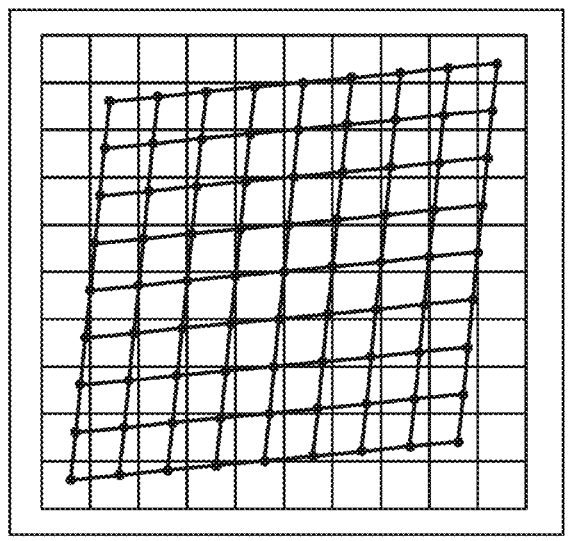
Figure 3D:
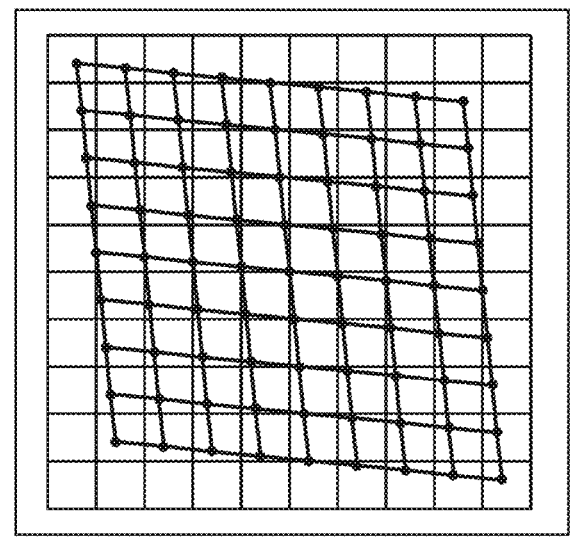

In the example described above, a trapezoidal shape is corrected by θZ rotation or Z driving of the first optical element 211 having the rotational asymmetric shape expressed by equation (1). Here, when the technique disclosed in Japanese Patent Laid-Open No. 2014-120682 is used, by driving the first optical element 211 along the X-axis direction by the optical element driver 22, a distortion with a TY_45 component occurs as shown in each of FIGS. 3C and 3D. Further, by driving the first optical element 211 along the Y-axis direction, a distortion with a TY_0 component occurs as shown in each of FIGS. 3A and 3B. Therefore, by simultaneously controlling the driving amounts of the first optical element 211 in the X direction, the Y direction, the Z direction, and the θZ rotation direction, it is possible to control both the trapezoidal component and the vertical/horizontal magnification difference component.

Figure 8A:
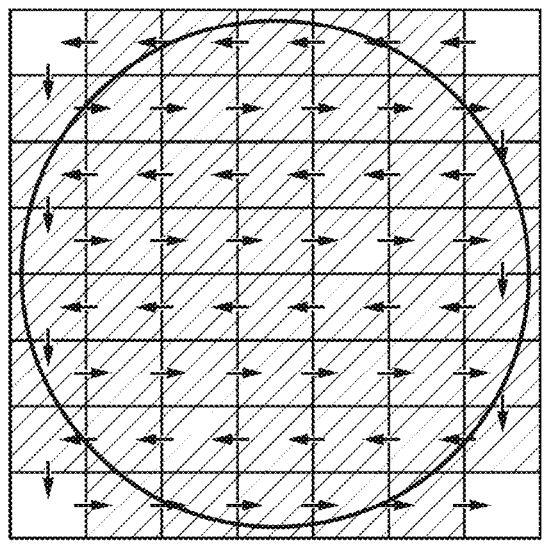
FIGS. 8A and 8B are views each showing an example of an order of shot exposure in a wafer.

FIG. 8A shows an example of a general order of exposure in a wafer. Each grid represents a shot, and an arrow between grids indicates the direction of stage movement from the immediately preceding exposure shot. In the case shown in FIG. 8A, the frequency of step driving from the adjacent shot in the horizontal direction (X direction) in the plane of the drawing surface is high. Depending on the heat amount applied to the wafer by the preceding exposed shot, the wafer thermally expands. Here, the thermal expansion amount decreases as the distance from the shot increases. Then, in sequential exposure with step driving in the X direction, the thermal expansion amount changes in the horizontal direction, so that the shot region has a distortion shape such as a trapezoid having different left and right side lengths. In this case, the adjustment amount of Δbase_LR becomes effective.

Adjustment of Δbase_LR is related to the three-fold rotational symmetric aspherical shape of each of the first inner surface 211b of the first optical element 211 and the second inner surface 212b of the second optical element 212 facing each other. By forming each of the inner surfaces 211b and 212b to be an aspherical shape having a phase of sin 3θ as expressed by equation (1), Δbase_LR can be generated by rotationally driving the complementary optical element. In general, rotational driving can be performed at a higher speed than Z driving, so that in the case of the order of exposure shown in FIG. 8A, an aspherical surface having a phase of sin θ is desirable. Adjustment of the TY_0 component and adjustment of the TY_45 component (see Japanese Patent Laid-Open No. 2014-120682) are realized by driving the optical element in the X direction and the Y direction, respectively. Since these are both driving of the optical element in the horizontal direction, a simple mechanism can perform a shift and rotation on the same plane.

In this embodiment, the first optical element 211 includes the first surface 211b having the three-fold rotational symmetric aspherical shape with respect to the optical axis of the exposure light. In addition, the second optical element 212 includes the second surface 212b that faces the first surface 211b and has an aspherical shape that complementarily corrects an aberration generated by the first optical element 211.

The rotational asymmetric shape of each of the first surface 211b of the first optical element 211 and the second surface 212b of the second optical element 212 facing each other may be, for example, a shape expressed by the following equation:

$$Z=C(x^3-3xy^2)+D \quad (3)$$

where C and D are constants.

When expressed in polar coordinates, equation (3) is expressed as:

$$Z=\rho^3 \cos 3\theta \quad (4)$$

A trapezoidal distortion with Δbase_UD having different upper and lower side lengths occurs depending on the rotation amount of the first optical element 211, and a trapezoidal distortion with Δbase_LR having different left and right side lengths occurs depending on the driving amount of Z driving of the first optical element 211. Further, by driving the first optical element 211 in the Y direction, a distortion with the TY_45 component as shown in each of FIGS. 3C and 3D occurs. Furthermore, by driving the first optical element 211 in the X direction, a distortion with the TY_0 component as shown in each of FIGS. 3A and 3B occurs.

Figure 8B:
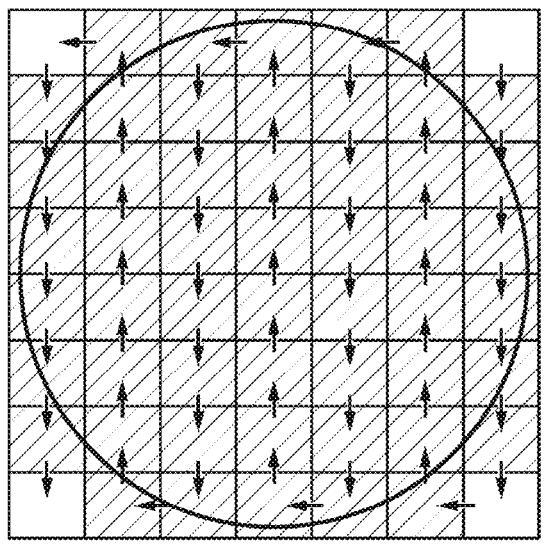

When the order of exposure in the wafer is as shown in FIG. 8B, the frequency of step driving from the adjacent shot in the vertical direction (Y direction) in the plane of the drawing surface is high. When driving in the Y direction, the expansion amount changes in the vertical direction in the plane of the drawing surface of FIG. 8B, so that the shot region has a distortion shape such as a trapezoid whose upper and lower sides in the plane of the drawing surface have different lengths. In this case, the adjustment amount of Δbase_UD becomes effective.

Adjustment of Δbase_UD is related to the three-fold rotational symmetric aspherical shape of each of the first surface 211b of the first optical element 211 and the second surface 212b of the second optical element 212 facing each other. By forming each of the first surface 211b and the second surface 212b to be an aspherical shape having a phase of cos 3θ as expressed by equation (3), Δbase_UD can be generated by rotational driving of the complementary optical element. In the case of the order of exposure shown in FIG. 8B, an aspherical surface having a phase of cos θ is desirable.

The exposure apparatus generally has regularity in the order of exposure of shot regions from the viewpoint of production efficiency. By forming each of the first surface 211b of the first optical element 211 and the second surface 212b of the second optical element 212 facing each other to be an aspherical shape in accordance with the order of exposure of shot regions in the wafer as described above, the overlay accuracy can be improved with a simple driving mechanism configuration.

Examples of the aspherical shape of each of the first surface 211b of the first optical element 211 and the second surface 212b of the second optical element 212 facing each other include the shape expressed by equation (1) and the shape expressed by equation (3), but the aspherical shape is not limited thereto. For example, the similar effect can be obtained even with a three-fold rotational symmetric aspherical shape expressed by following equation (5) or equation (6):

$$Z=f(\rho)\cos 3\theta+E \quad (5)$$

$$Z=g(\rho)\sin 3\theta+F \quad (6)$$

where $f(\rho)$ and $g(\rho)$ are functions having a variable $\rho$, and E and F are constants.

In this manner, the trapezoidal distortion of the underlayer can be effectively corrected by at least one of rotation and Z driving of the optical element having a three-fold rotational symmetric aspherical surface.

Second Embodiment

Figure 10:
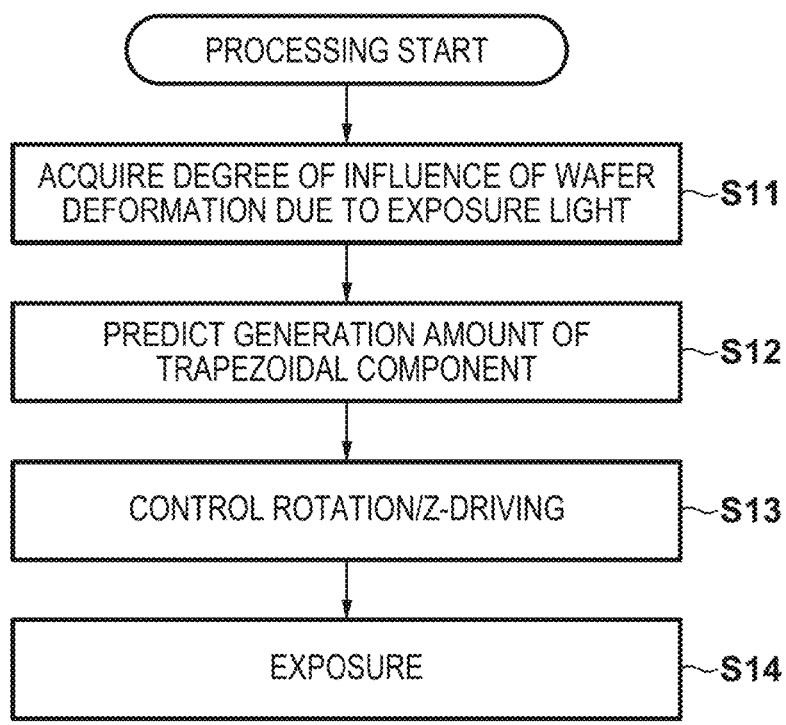
FIG. 10 is a flowchart illustrating an exposure method according to the second embodiment.

Next, another example of the exposure method using an aberration correction member 21 that adjusts a distortion aberration having a trapezoidal shape will be described with reference to FIG. 10. In step S11, a main controller 103 acquires, before performing exposure, information of a degree of influence of wafer deformation due to the exposure light of the preceding shot. The degree of influence of wafer deformation due to the exposure light is determined based on, for example, exposure conditions such as heat input parameters based on the exposure energy, parameters related to a stage movement vector from the preceding shot, and parameters related to physical properties of the wafer.

The parameters related to the physical properties of the wafer can include a coefficient of linear expansion and thermal conductivity. The coefficient of expansion of the wafer due to heat is determined based on the coefficient of linear expansion. In addition, since a distance from the center of the preceding shot region is different between the both ends of the shot region to be exposed next, the coefficient of expansion corresponding to the thermal conductivity of the wafer differs between the both ends of the shot region. As the wafer, for example, substrates having different physical properties such as Si, GaAs, and a glass substrate can be used. In addition, a Cu layer may be formed on the wafer in a underlayer treatment process. For these reasons, the physical properties of the wafer can change.

The heat input parameters based on the exposure energy can include the exposure amount and the exposure light reflectance and transmittance of the wafer. The photoresist applied on the wafer has a predetermined appropriate exposure amount according to its type. The irradiation energy is determined by the product of the size of the shot region and the exposure amount. The energy obtained by excluding, from the irradiation energy, the reflected light and transmitted light of the substrate is the absorption energy contributing to the thermal deformation of the wafer. The wafer is thermally deformed in proportion to the absorption energy.

The parameters related to the stage movement vector include information on the pitch between shots and the order of exposure of a plurality of shot regions.

The pitch between shots on the wafer is related to the driving time of the substrate stage between shot regions of an exposure apparatus that performs sequential exposure. Accordingly, the time from the completion of exposure of the preceding shot to the start of exposure of the target shot is determined by the pitch between shots on the wafer. The positional relationship between the center of the preceding shot and the exposure shot is determined by the order of exposure of the shots, and the distribution of the heat transmitted to the exposure shot is obtained. Therefore, the difference in coefficient of expansion of the substrate between the both ends of the shot is determined. This indicates the direction of the trapezoidal shape.

In addition, when continuously performing exposure on a plurality of wafers, the heat storage amount of the wafer stage is also an important parameter. This is because when the temperature of the wafer stage rises, the wafer mounted thereon thermally deforms.

For example, the main controller 103 actually performs exposure under each of a plurality of conditions, measures a distortion that has occurred as a result to obtain the degree of influence of wafer deformation for each condition, and stores it as a database (table). In step S11, the main controller 103 may obtain the degree of influence by referring to this table. Alternatively, the degree of influence of wafer deformation for each condition may be converted into a function, and the main controller 103 may calculate the degree of influence by applying the condition at the time of exposure to the function.

In this manner, by obtaining the parameters (conditions) that determine the influence of the exposure heat of the preceding shot on the wafer deformation, the trapezoidal component to be generated can be predicted.

Next, in step S12, the main controller 103 predicts the trapezoidal component generation amount based on the degree of influence acquired in step S11. Based on the predicted trapezoidal component generation amount, the main controller 103 calculates the driving amount of the optical element necessary for correcting the trapezoidal component by an optical element controller 123. In step S13, the main controller 103 controls an optical element driver 22 to perform at least one of θZ rotation and Z driving of a first optical element 211 with the driving amount calculated in step S12. After the above-described aberration correction is performed, the main controller 103 performs exposure in step S14.

According to the exposure method described above, even when the amount of wafer deformation due to the heat of the exposure light changes in accordance with the physical properties of the wafer, the exposure amount of the exposure apparatus, the stage driving speed, or the like, it is possible to perform exposure while appropriately correcting the trapezoidal component of distortion.

Note that in the above-described embodiment, an example in which the trapezoidal component is corrected has been described. However, the correction target is not limited to the trapezoidal component.

In the above-described embodiment, it has been shown that the TY_0 component and the TY_45 component can be adjusted by driving the first optical element 211 having, for example, the shape expressed by equation (1) in the X direction and the Y direction, respectively. Therefore, by combining θZ rotation, Z driving, driving in the X direction, and driving in the Y direction, it becomes possible to adjust vertical/horizontal magnification difference components in arbitrary directions and correct the trapezoidal shape.

As has been described above, adjustment of the Δbase_LR necessary for most shot regions on the wafer is performed by θZ rotation. Further, the TY_0 component and the TY_45 component are adjusted by performing driving in the X direction and driving in the Y direction, respectively. Since these are both driving of the first optical element 211 in the horizontal direction, a simple drive mechanism configuration can implement the correction.

As has been described above, according to the embodiment, the aberration correction member includes at least one of a θZ-rotation mechanism and a Z-driving mechanism for an optical element including a three-fold rotational symmetric aspheric surface. Therefore, it is possible to acquire the degree of influence of substrate deformation due to the exposure light of the preceding shot and effectively correct a trapezoidal distortion.

Note that the present invention is not limited to measuring the distortion of the underlayer and correcting the trapezoidal component in accordance with the underlayer. It is also possible to correct the trapezoidal component of the distortion of a first layer so as to form it into a distortion close to a desired shape such as a grid, thereby improving the overlay accuracy upon performing exposure for a second and subsequent layers.

<Embodiment of Article Manufacturing Method>

An article manufacturing method according to an embodiment of the present invention suitably manufactures an article, for example, a microdevice such as a semiconductor device or an element having a microstructure. The article manufacturing method of this embodiment includes a step of forming a latent pattern by using the above-described exposure apparatus on a photoresist applied on a substrate (a step of exposing the substrate), and a step of developing the substrate on which the latent pattern has been formed in the above step. In addition, the manufacturing method includes other well-known steps (for example, oxidation, film formation, deposition, doping, planarization, etching, resist removal, dicing, bonding, and packaging). The article manufacturing method of this embodiment is more advantageous than the conventional methods in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-045138, filed Mar. 12, 2019, which is hereby incorporated by reference herein in its entirety.

What is claimed is:

1. An exposure apparatus that projects a pattern of an original onto a substrate via a projection optical system and exposes the substrate, the apparatus comprising:
an aberration correction member arranged on an optical path of exposure light between the original and the substrate; and
a driver configured to drive the aberration correction member,
wherein the aberration correction member comprises
a first optical element including a first surface having a three-fold rotational symmetric aspherical shape with respect to an optical axis of the exposure light, and
a second optical element spaced apart from the first optical element along the optical axis and including a second surface facing the first surface and having an aspherical shape that is complementary to the aspherical shape of the first surface, and
the driver performs at least one of rotation about the optical axis and driving along the optical axis of at least one of the first optical element and the second optical element so as to compensate a trapezoidal component of a shape of a shot region of the substrate.

2. The apparatus according to claim 1, wherein when a direction parallel to the optical axis is a Z-axis and directions perpendicular to each other on a plane orthogonal to the Z-axis are an X-axis and a Y-axis, by the driver performing at least one of rotation about the Z-axis and driving along the Z-axis of at least one of the first optical element and the second optical element, lengths of two sides in a direction along the Y-axis and lengths of two sides in a direction along the X-axis of a shot region are corrected.

3. The apparatus according to claim 1, further comprising a controller configured to control at least one of a rotation amount of rotation about the optical axis and a driving amount of driving along the optical axis.

4. The apparatus according to claim 3, wherein the controller acquires data of the shape of the shot region serving as an underlayer of the substrate and, based on the acquired data, controls at least one of the rotation amount of rotation about the optical axis and the driving amount of driving along the optical axis.

5. The apparatus according to claim 4, further comprising a measurement device configured to measure the shape of the shot region,
wherein the controller acquires the data of the shape of the shot region from the measurement device.

6. The apparatus according to claim 3, wherein the controller acquires information of the degree of influence of deformation of the substrate and, based on the acquired information, controls at least one of the rotation amount of rotation about the optical axis and the driving amount of driving along the optical axis.

7. The apparatus according to claim 6, wherein the information includes information of an order of exposure of a plurality of shot regions of the substrate.

8. The apparatus according to claim 7, wherein the information further includes at least one of an exposure amount with respect to a photoresist on the substrate, a heat storage amount of a substrate stage holding the substrate, a driving time of the substrate stage between the shot regions, and a coefficient of linear expansion, a thermal conductivity, an exposure light reflectance, and a transmittance of the substrate.

9. The apparatus according to claim 1, wherein the driver further performs driving in a direction orthogonal to the optical axis of at least one of the first optical element and the second optical element.

10. The apparatus according to claim 1, wherein the aberration correction member is arranged between the original and the projection optical system.

11. The apparatus according to claim 1, wherein the aberration correction member is provided in the projection optical system.

12. The apparatus according to claim 1, wherein the aberration correction member is provided in a reticle stage configured to hold the original.

13. An article manufacturing method comprising:
exposing a substrate using an exposure apparatus defined in claim 1, and
developing the exposed substrate,
wherein an article is manufactured from the developed substrate.

14. The apparatus according to claim 1, wherein the trapezoidal component is predicted based on a degree of influence of deformation of the substrate.

* * * * *